United States Patent
Kasch et al.

(10) Patent No.: US 10,360,335 B2
(45) Date of Patent: Jul. 23, 2019

(54) DISTRIBUTED SENSOR NETWORK FOR MEASURING AND OPTIMIZING WIRELESS NETWORKS

(71) Applicant: Greenlee Textron, Inc., Rockford, IL (US)

(72) Inventors: William Thomas Morgan Kasch, Vista, CA (US); Mark G. Barmettler, Visa, CA (US)

(73) Assignee: Tempo Communications, Inc., Vista, CA (US)

( * ) Notice: Subject to any disclaimer, the term of this patent is extended or adjusted under 35 U.S.C. 154(b) by 0 days.

(21) Appl. No.: 15/688,099

(22) Filed: Aug. 28, 2017

(65) Prior Publication Data

US 2018/0060476 A1 Mar. 1, 2018

Related U.S. Application Data

(60) Provisional application No. 62/380,909, filed on Aug. 29, 2017.

(51) Int. Cl.
*G06F 17/50* (2006.01)
*G01D 15/06* (2006.01)
(Continued)

(52) U.S. Cl.
CPC ......... *G06F 17/5072* (2013.01); *G01D 15/06* (2013.01); *H04W 16/18* (2013.01);
(Continued)

(58) Field of Classification Search
CPC .................................................. G06F 17/5072
(Continued)

(56) References Cited

U.S. PATENT DOCUMENTS

| 6,499,006 B1 | 12/2002 | Rappaport |
| 7,515,916 B1 | 4/2009 | Alexander |

(Continued)

FOREIGN PATENT DOCUMENTS

| EP | 2874429 A1 | 5/2015 |
| WO | 2009022054 A1 | 2/2009 |
| WO | 2013152305 A1 | 10/2013 |

OTHER PUBLICATIONS

AirCheck Wi-Fi Tester—Wireless Network Tester—Fluke Networks—w2ww.flukenetworks.com/enterprise-network/network-testing/AirCheckWi-Fi-Tester 2 pages Oct. 9, 2013.

(Continued)

*Primary Examiner* — Suresh Memula
(74) *Attorney, Agent, or Firm* — Erise IP, P.A.

(57) ABSTRACT

Methods of planning network provisioning that incorporate real-world measurements of signal quality into simulations of signal quality under alternative configurations. In one embodiment, the disclosure includes a method of determining placements for access points in a wireless network, comprising ingesting a floor plan for a deployment site, determining initial placements for the access points, determining placements for sensors, each sensor configured to wirelessly communicate with at least one access point, measuring a signal metric for each sensor, based at least in part on the measured signal metric for each of the sensors, simulating a projected coverage map for a plurality of alternate placements for the access points, determining an placement of the access points, and presenting, to a user, the placement of the plurality of access points.

21 Claims, 4 Drawing Sheets

(51) Int. Cl.
  *H04W 16/18* (2009.01)
  *H04W 24/08* (2009.01)
  *H04W 24/02* (2009.01)
  *H04W 24/06* (2009.01)

(52) U.S. Cl.
  CPC ............ *H04W 24/08* (2013.01); *H04W 24/02* (2013.01); *H04W 24/06* (2013.01)

(58) Field of Classification Search
  USPC ......................................................... 716/122
  See application file for complete search history.

(56) References Cited

U.S. PATENT DOCUMENTS

| | | | |
|---|---|---|---|
| 7,539,489 | B1 | 5/2009 | Alexande |
| 7,574,202 | B1 | 8/2009 | Tsao |
| 7,596,373 | B2 | 9/2009 | McGregor et al. |
| 7,889,663 | B1 | 2/2011 | Wright et al. |
| 8,023,418 | B2 | 9/2011 | Curley |
| 8,390,515 | B2 | 3/2013 | Ketonen |
| 8,416,710 | B2 | 4/2013 | Brisebois |
| 8,625,441 | B2 | 1/2014 | Hittel et al. |
| 8,654,660 | B2 | 2/2014 | Ketonen |
| 8,750,806 | B2 | 6/2014 | Weil et al. |
| 8,824,328 | B2 | 9/2014 | Dhanapal |
| 9,002,349 | B2 | 4/2015 | Naguib |
| 9,781,609 | B1 | 10/2017 | Kurtz |
| 9,924,388 | B2 | 3/2018 | Zhang |
| 2002/0111772 | A1 | 8/2002 | Skidmore et al. |
| 2003/0055604 | A1 | 3/2003 | Skidmore et al. |
| 2003/0229478 | A1 | 12/2003 | Rappaport et al. |
| 2004/0137915 | A1 | 7/2004 | Diener |
| 2005/0003827 | A1 | 1/2005 | Whelan |
| 2005/0043933 | A1 | 2/2005 | Rappaport et al. |
| 2005/0055604 | A1 | 3/2005 | Skidmore et al. |
| 2007/0082677 | A1 | 4/2007 | Hart et al. |
| 2009/0003219 | A1* | 1/2009 | Beacham ................ H04L 43/00 370/241 |
| 2010/0124886 | A1* | 5/2010 | Fordham .............. H04B 17/382 455/67.11 |
| 2010/0290359 | A1 | 11/2010 | Dewey |
| 2012/0115523 | A1 | 5/2012 | Shpak |
| 2012/0129559 | A1 | 5/2012 | Pochop, Jr. |
| 2012/0307662 | A1 | 12/2012 | Puolakka et al. |
| 2013/0051252 | A1 | 2/2013 | Ciavattone |
| 2014/0029450 | A1 | 1/2014 | Vitek |
| 2014/0160971 | A1 | 6/2014 | Ketonen |
| 2014/0160972 | A1 | 6/2014 | Ketonen |
| 2014/0328190 | A1 | 11/2014 | Lord |
| 2014/0330541 | A1 | 11/2014 | Natarajan |
| 2015/0014613 | A1 | 1/2015 | Horndacher et al. |
| 2015/0085746 | A1 | 3/2015 | Somayazulu |
| 2015/0103685 | A1 | 4/2015 | Butchko |
| 2015/0131483 | A1 | 5/2015 | Colban |
| 2015/0212633 | A1 | 7/2015 | Flanagan |
| 2015/0304816 | A1 | 10/2015 | Al-Najjar |
| 2016/0191357 | A1 | 6/2016 | Orner |
| 2016/0323760 | A1 | 11/2016 | Zhang et al. |
| 2016/0373944 | A1* | 12/2016 | Jain ........................ H04L 43/50 |
| 2017/0078896 | A1 | 3/2017 | Kephart, Jr. |
| 2017/0171760 | A1 | 6/2017 | Kamalakannan |
| 2017/0223551 | A1 | 8/2017 | Huang |
| 2017/0238346 | A1* | 8/2017 | Egner ................... H04W 4/029 370/338 |

OTHER PUBLICATIONS

European Patent Application 14187880.1 European Examination Report dated Apr. 16, 2015.
European Patent Application No. 14187880.1 Office Action dated Jun. 28, 2017.
Fluke Networks, "Airmagnet Planner Technical Data," Copyright 2011.
Greenlee Communications, "AirScout Automated WiFi Readiness," http://www.greenleecommunications.com/products/airscout-wifi-readiness.html, printed Apr. 19, 2016, Copyright 2016.
Greenlee Textron, Inc., "Greenlee Communications AirScout Instruction Manual 52075869REV01," Copyright 2016.
iBwave, "In-Building Wireless Network Design Software, iBwave Design," http://www.ibwave.com/Products/iBwaveDesign.aspx. printed Apr. 19, 2016, posted unknown.
PCT Patent Application PCT/US2016/018826 International Search Report and Written Opinion dated May 10, 2016, 15 pages.
European Patent Application 17166913.8 Search Report dated Oct. 8, 2017.
Greenlee Textron, Inc., "Project Orion," Jul. 31, 2014.

* cited by examiner

DISTRIBUTED SENSOR NETWORK FOR MEASURING AND OPTIMIZING WIRELESS NETWORKS

RELATED APPLICATIONS

This non-provisional patent application claims priority benefit, with regard to all common subject matter, of earlier-filed U.S. Provisional Patent Application No. 62/380,909 filed Aug. 29, 2017 and entitled DISTRIBUTED SENSOR NETWORK FOR MEASURING AND OPTIMIZING WIRELESS NETWORKS. The identified earlier-filed provisional patent application is hereby incorporated by reference in its entirety into the present application. This non-provisional patent application also shares certain common subject matter with earlier-filed U.S. patent application Ser. No. 14/506,106 filed Oct. 3, 2014 and entitled PLACED WIRELESS INSTRUMENTS FOR PREDICTING QUALITY OF SERVICE and with earlier-filed U.S. patent application Ser. No. 15/048,801 filed May 19, 2016 and entitled SYSTEM AND METHOD FOR GENERATING A GRAPHIC ILLUSTRATION OF WIRELESS NETWORK PERFORMANCE. These identified earlier-filed patent applications are hereby incorporated by reference in their entirety into the present application.

BACKGROUND

1. Field

Embodiments of the disclosure generally relate to planning, validation, and optimization of wireless communication networks and, more particularly, to installation, deployment, troubleshooting, and maintenance of large-scale local-area wireless network infrastructure.

2. Related Art

Traditionally, determining optimal placements of access points for large-scale wireless networks has been a laborious process, requiring deploying the access points in a proposed configuration, measuring signal quality at a variety of locations, moving the access points to adjust coverage, and repeating until adequate coverage is achieved throughout the deployment site. In addition to the required labor, this process is slow and results in an adequate configuration, rather than an optimal one. However, techniques for simulating signal quality across a wide variety of configurations without actually deploying the access points and measuring the signal quality provide inaccurate results due to variable signal propagation from real world effects such as interfering networks, different building materials, furniture, etc. As a result, there is a need for a network provisioning planner that can rapidly and accurately simulate proposed network access point configurations without requiring actual deployments.

SUMMARY

Embodiments of the disclosure address the above-described by providing for a network provisioning planner that incorporates real-world measurements of signal quality into simulations of signal quality under alternative configurations. In particular, in a first embodiment, a method is provided that includes determining placements for a plurality of access points in a large-scale wireless network, comprising ingesting a floor plan for a deployment site, determining a plurality of initial placements for the plurality of access points, determining a plurality of placements for a plurality of sensors, wherein each sensor is configured to wirelessly communicate with at least one access point of the plurality of access points, measuring a signal metric for each sensor of the plurality of sensors, based at least in part on the measured signal metric for each of the plurality of sensors, simulating a projected coverage map for each of a plurality of alternate placements for the plurality of access points, determining a placement of the plurality of alternate placements for the plurality of access points, and presenting, to a user, the placement of the plurality of access points.

In a second embodiment, one or more non-transitory computer storage media are provided, which store computer-executable instructions that, when executed by a processor, perform a method of determining placements for a plurality of access points in a large-scale wireless network, the method comprising ingesting a floor plan for a deployment site, determining a plurality of initial placements for the plurality of access points, wherein determining the plurality of initial placements includes determining an estimated signal metric throughout the deployment site based at least in part on the plurality of initial placements for the plurality of access points, determining a plurality of placements for a plurality of sensors, wherein each sensor is configured to wirelessly communicate with at least one access point of the plurality of access points, measuring a signal metric for each sensor of the plurality of sensors, based at least in part on the measured signal metric for each of the plurality of sensors and the estimated signal metric at each of the plurality of sensors, simulating a projected coverage map for each of a plurality of alternate placements for the plurality of access points, determining a placement of the plurality of alternate placements for the plurality of access points, and causing to be presented, to a user, the placement of the plurality of access points.

In a third embodiment, the disclosure includes a system for determining placements for a plurality of access points in a wireless network, comprising a plurality of sensors, each sensor of the plurality of sensors configured to wirelessly communicate with at least one access point of the plurality of access points, and one or more computer storage media storing computer-executable instructions that, when executed by a processor, perform a method of determining placements for a plurality of access points in a wireless network, the method comprising ingesting a floor plan for a deployment site, determining, via a simulation of a signal metric, a plurality of initial placements for the plurality of access points, determining a plurality of placements for the plurality of sensors, measuring the signal metric for each sensor of the plurality of sensors, based at least in part on the measured signal metric for each of the plurality of sensors, simulating a projected coverage map for each of a plurality of alternate placements for the plurality of access points, determining an placement of the plurality of alternate placements for the plurality of access points, and causing to be presented, to a user, the placement of the plurality of access points.

In a fourth embodiment, the disclosure includes An apparatus for determining placements for a plurality of access points in a wireless network, comprising a processor, a communication interface communicatively coupled to a plurality of sensors, each sensor of the plurality of sensors configured to wirelessly communicate with at least one access point of the plurality of access points, a display configured to present a user interface to a user, and a memory storing program instructions that, when performed by the processor, cause the at least one processor to ingest a floor plan for a deployment site, determine a plurality of initial placements for the plurality of access points, wherein determining the plurality of initial placements includes determining an estimated signal metric throughout the deployment site based at least in part on the plurality of initial placements for the plurality of access points, determine a plurality of placements for a plurality of sensors, wherein each sensor is configured to wirelessly communicate with at least one access point of the plurality of access points, receive a signal metric for each sensor of the plurality of sensors, based at least in part on the received signal metric for each of the plurality of sensors and the estimated signal metric at each of the plurality of sensors, simulate a projected coverage map for each of a plurality of alternate placements for the plurality of access points, determine a placement of the plurality of alternate placements for the plurality of access points, and cause the display to present, to the user, the placement of the plurality of access points.

This summary is provided to introduce a selection of concepts in a simplified form that are further described below in the detailed description. This summary is not intended to identify key features or essential features of the claimed subject matter, nor is it intended to be used to limit the scope of the claimed subject matter or of the disclosure. Other aspects and advantages of various embodiments within the scope of the current disclosure will be apparent from the following detailed description of the embodiments and the accompanying drawing figures.

BRIEF DESCRIPTION OF THE DRAWING FIGURES

Embodiments of the disclosure are described in detail below with reference to the attached drawing figures, wherein.

DETAILED DESCRIPTION

At a high level, embodiments of the disclosure initially measure network signal coverage using wireless network sensors placed throughout a deployment site. The measurements from these sensors can then be fed, together with a floor plan for the deployment site, into a simulation engine that can estimate the optimal deployment for access points using (for example) Monte Carlo simulation. This simulation engine can then recommend optimal access point placements and channel assignments to maximize signal coverage across the deployment site.

The subject matter of embodiments of the disclosure is described in detail below to meet statutory requirements; however, the description itself is not intended to limit the scope of claims. Rather, the claimed subject matter might be embodied in other ways to include different operations or combinations of operations similar to the ones described in this document, in conjunction with other present or future technologies. Minor variations from the description below will be obvious to one skilled in the art, and are intended to be captured within the scope of the claimed disclosure. Terms should not be interpreted as implying any particular ordering of various operations described unless the order of individual operations is explicitly described.

The following detailed description of embodiments of the disclosure references the accompanying drawings that illustrate specific embodiments that can be practiced. The disclosure is intended to describe aspects of the embodiments in sufficient detail to enable those skilled in the art to practice them. Other embodiments can be utilized and changes can be made without departing from the scope of the disclosure. The following detailed description is, therefore, not to be taken in a limiting sense.

In this description, references to "one embodiment," "an embodiment," or "embodiments" mean that the feature or features being referred to are included in at least one embodiment of the technology. Separate reference to "one embodiment" "an embodiment", or "embodiments" in this description do not necessarily refer to the same embodiment and are also not mutually exclusive unless so stated and/or except as will be readily apparent to those skilled in the art from the description. For example, a feature, structure, or act described in one embodiment may also be included in other embodiments, but is not necessarily included. Thus, the technology can include a variety of combinations and/or integrations of the embodiments described herein.

Figure 1:
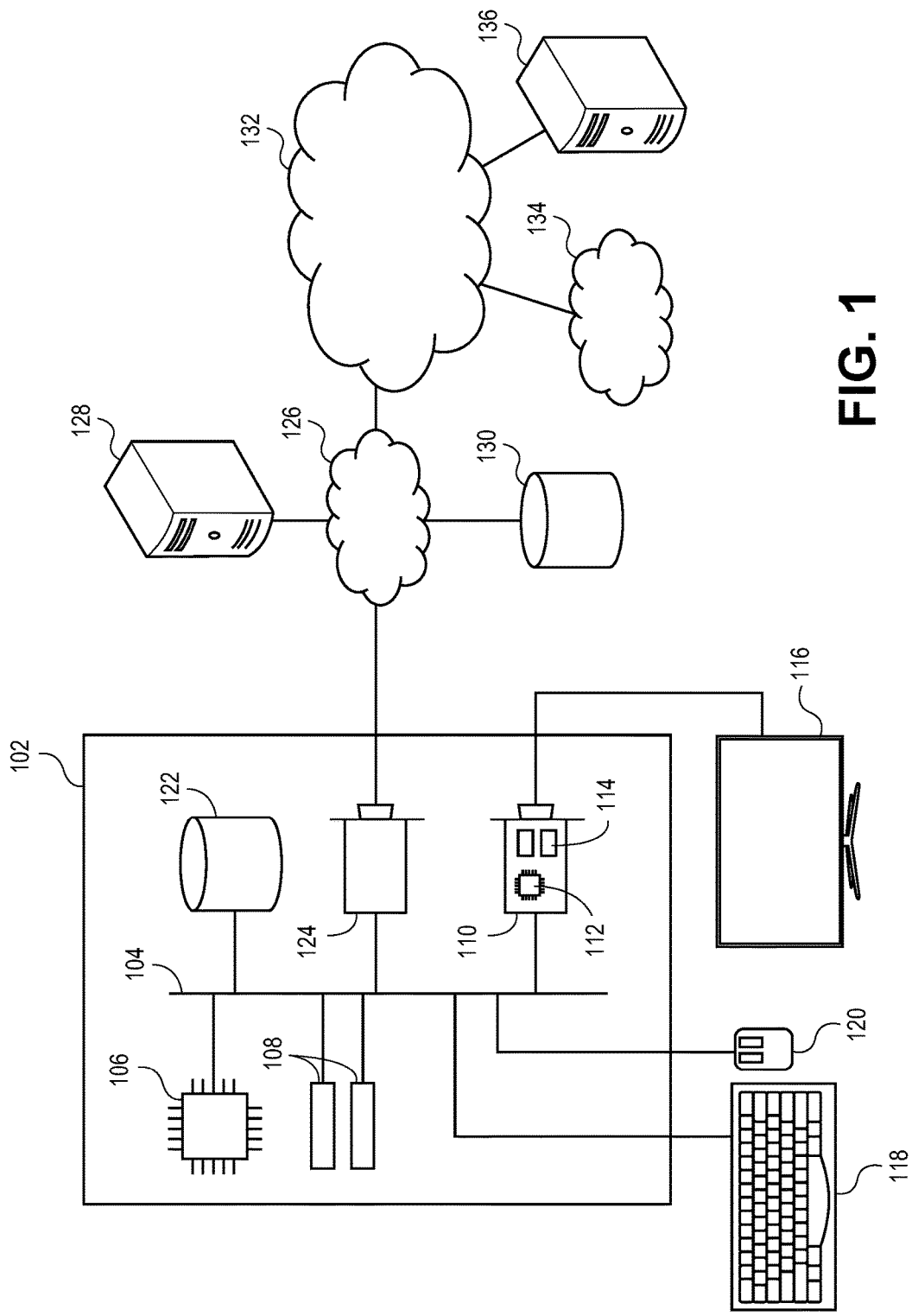
FIG. 1 depicts an example hardware platform according to certain embodiments of the disclosure.

Turning first to FIG. 1, an example hardware platform for certain embodiments of the disclosure is depicted. Computer 102 can be a desktop computer, a laptop computer, a server computer, a mobile device such as a smartphone or tablet, or any other form factor of general- or special-purpose computing device. Depicted with computer 102 are several components, for illustrative purposes. In some embodiments, certain components may be arranged differently or absent. Additional components may also be present. Included in computer 102 is system bus 104, whereby other components of computer 102 can communicate with each other. In certain embodiments, there may be multiple busses or components may communicate with each other directly. Connected to system bus 104 is central processing unit (CPU) 106. Also attached to system bus 104 are one or more random-access memory (RAM) modules. Also attached to system bus 104 is graphics card 110. In some embodiments, graphics card 104 may not be a physically separate card, but rather may be integrated into the motherboard or the CPU 106. In some embodiments, graphics card 110 has a separate graphics-processing unit (GPU) 112, which can be used for graphics processing or for general purpose computing (GPGPU). Also on graphics card 110 is GPU memory 114. Connected (directly or indirectly) to graphics card 110 is display 116 for user interaction. In some embodiments no display is present, while in others it is integrated into computer 102. Similarly, peripherals such as keyboard 118 and mouse 120 may be connected to system bus 104. Like display 116, these peripherals may be integrated into computer 102 or absent. Also connected to system bus 104 is local storage 122, which may be any form of computer-readable media, and may be internally installed in computer 102 or externally and removeably attached.

Computer-readable media include both volatile and nonvolatile media, removable and nonremovable media, and contemplate media readable by a database. For example, computer-readable media include (but are not limited to) RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data temporarily or permanently. However, unless explicitly specified otherwise, the term "computer-readable media" should not be construed to include physical, but transitory, forms of signal transmission such as radio broadcasts, electrical signals through a wire, or light pulses through a fiber-optic cable. Examples of stored information include computer-useable instructions, data structures, program modules, and other data representations.

Finally, network interface card (NIC) 124 is also attached to system bus 104 and allows computer 102 to communicate over a network such as network 126. NIC 124 can be any form of network interface known in the art, such as Ethernet, ATM, fiber, Bluetooth, or Wi-Fi (i.e., the IEEE 802.11 family of standards). NIC 124 connects computer 102 to local network 126, which may also include one or more other computers, such as computer 128, and network storage, such as data store 130. Generally, a data store such as data store 130 may be any repository from which information can be stored and retrieved as needed. Examples of data stores include relational or object oriented databases, spreadsheets, file systems, flat files, directory services such as LDAP and Active Directory, or email storage systems. A data store may be accessible via a complex API (such as, for example, Structured Query Language), a simple API providing only read, write and seek operations, or any level of complexity in between. Some data stores may additionally provide management functions for data sets stored therein such as backup or versioning. Data stores can be local to a single computer such as computer 128, accessible on a local network such as local network 126, or remotely accessible over Internet 132. Local network 126 is in turn connected to Internet 132, which connects many networks such as local network 126, remote network 134 or directly attached computers such as computer 136. In some embodiments, computer 102 can itself be directly connected to Internet 132.

In particular embodiments, network interface 124 may be a wireless network interface connecting to WiFi network 126 compliant with the IEEE 802.11a, 802.11b, 802.11g, 802.11n, 802.11ac, and/or other present or future iterations of the IEEE 802.11 standards. Alternatively, wireless network 126 may be compliant with another member of the 802.11 family of standards, or with any other wireless network standard. In some embodiments, wireless network 126 is a large-scale network. Broadly speaking, large-scale wireless networks comprise a plurality of access points between which attached devices (such as, for example, computer 102) can roam. These access points provide direct or indirect interconnection points between attached devices and the wired potions of network 126. For example, computer 102 may be wirelessly connected to a first access point, which is itself wirelessly connected to a second wireless access point, which is in turn attached to a wired LAN that makes up part of local network 126. Alternatively, the first access point may itself be directly connected to the wired LAN. One of skill in the art will appreciate that many arrangements of the components of network 126 are possible and contemplated as being within the scope of the disclosure.

Figure 2:
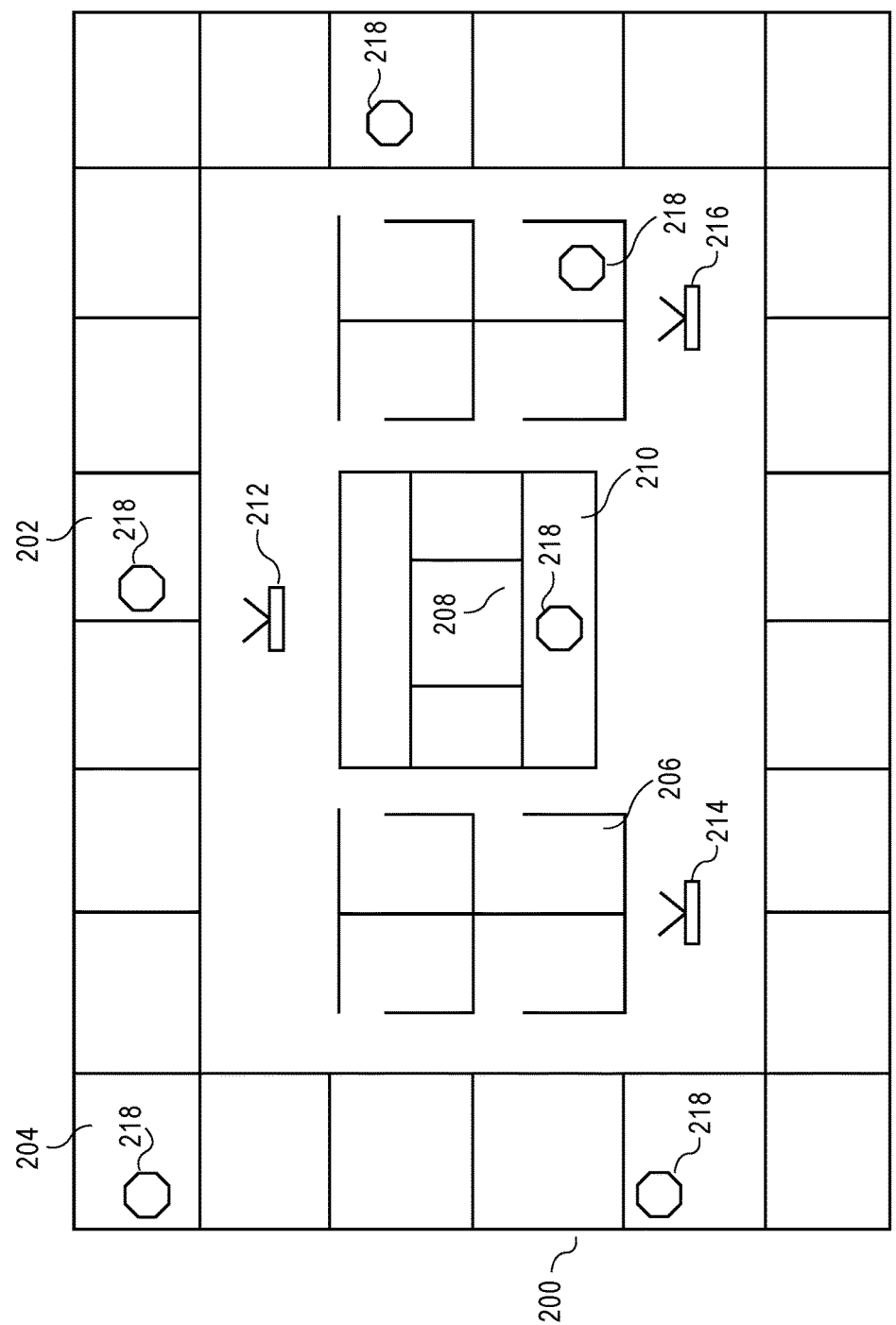
FIG. 2 depicts a floor plan representing a simplified environment in which embodiments of the disclosure might be used.

Turning now to FIG. 2, a floor plan representing a simplified environment in which embodiments of the disclosure might be used is depicted and referred to generally by reference numeral 200. For example, floor plan 200 may represent one floor of an office building in which a wireless network (such as wireless network 126) is to be deployed. One of skill in the art will appreciate that actual deployments may be much larger and more complicated than that depicted. Broadly speaking, the problem being solved is where to place access points so as to have the best levels of coverage throughout the deployment area.

Solving this problem offers several challenges. First, signal propagation may be affected by interior partitions, such as walls, windows, and structural building elements and may be affected differently by each. For example, floor plan 200 includes offices such as office 202 and corner office 204, cubicles such as cubicle 206, and building core 208. Thus, if access point 212 is placed as depicted, the signal strength at points equidistant from it may be high in the hallway, acceptable in office 202, moderate in cubicle 206, and poor in kitchen 210 due to the differences in the electromagnetic permittivity of the open areas, the office walls, and the building core. Similarly, cubicle 206 might receive a significantly stronger signal from access point 214 than from access point 212 even if they are equidistant, due to building core 208. Furthermore, certain materials may reflect RF signals causing interfering signal echoes and furniture and other features that may not be reflected on floor plans can also impact signal propagation.

Second, each access point will typically operate on one of a fixed number of channels or frequencies. Multiple access points operating on the same channel or frequency will interfere with each other. This means, for example, that coverage cannot be increased simply by increasing the number of access points deployed, because access points on the same channel with overlapping signals may actually reduce signal coverage in the area of overlap. Furthermore, because of the variable signal propagation discussed above, whether two access points on the same channel will overlap may be difficult to predict.

Finally, the signal quality at a given location may depend on the particular wireless interface 124 of computer 102 and access point of wireless network 126. For example, antenna design, RF signal leakage, and arrangement of multiple-input-multiple-output elements may differ between components such that one pair of devices placed at particular locations might have good signal strength, while another pair might have poor signal strength. One of skill will appreciate, then, that testing all of the various combinations and permutations of access point locations and device types rapidly becomes infeasible. However, techniques that attempt to determine access point locations based purely on simulations of RF propagation are also infeasible due to the unpredictable impact of real-world features as discussed above.

Figure 3:
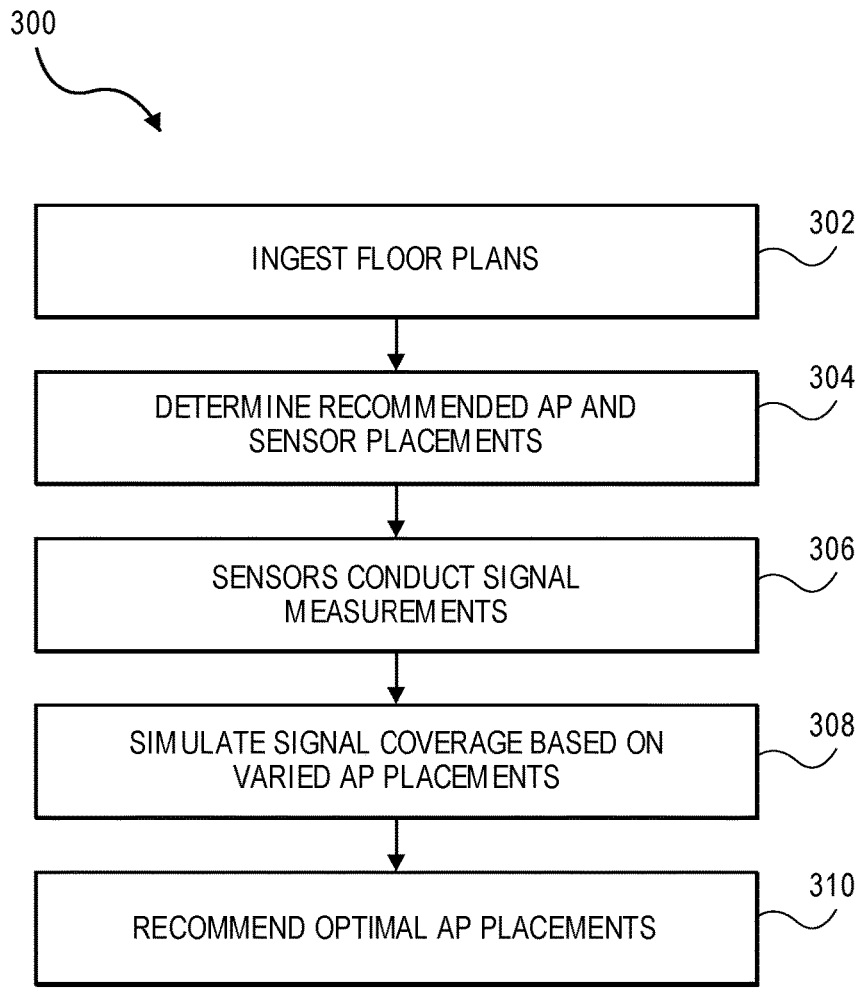
FIG. 3 depicts a flowchart illustrating the operation of a method in accordance with embodiments of the disclosure.

Turning now to FIG. 3, a flowchart illustrating the operation of a method in accordance with some example embodiments is depicted and referred to generally by reference numeral 300. Initially, at operation 302, a floor plan of the deployment area is ingested. In some embodiments, the floor plan may be as depicted in floor plan 200. In other embodiments, only walls and other structural elements are included. In still other embodiments, details such as furniture or sources of electromagnetic interference are also included in the floor plan to be ingested. In some embodiments, areas where signal strength is particularly important or unimportant can also be indicated on the floor plan. For example, it might be the case that wireless signal quality is particularly important in corner office 204, less important in kitchen 210, and completely unimportant in building core 208. In some embodiments, the floor plan is three-dimensional, reflecting the height of an access point location (e.g., on the ceiling or wall) in addition to the device locations (e.g., on a desk). In other embodiments, a two-dimensional floor plan is used to reduce modeling complexity. In some embodiments, multiple floors of a building are modeled at the same time, and the floor plan includes multiple floors. One of skill in the art will appreciate that a variety of additional information can be included in the ingested floor plan to improve the initial placement of sensors.

In some embodiments, information describing different materials used in the construction of the building may be annotated into the floor plan or otherwise included as supplementary information with the floor plan. This information can be used, directly or indirectly, to estimate signal propagation through the various materials. For example, in some embodiments, floor plan 200 might indicate that building core 208 is made of concrete, interior partitions are constructed from drywall over aluminum studs, and the floors are plywood over fiberboard joists. This information can then be combined with reference information describing the electromagnetic field propagation properties (e.g., electromagnetic permittivity and/or electromagnetic permeability) of each material. In other embodiments, the electromagnetic field propagation properties of the various features of floor plan 200 are included directly rather than looked up based at least in part on included building materials. In still other embodiments, electromagnetic field propagation properties are experimentally determined in the field from measurements made of the various types of building materials. In still other embodiments, electromagnetic field propagation properties of the various building materials are inferred based at least in part on the signal measurements made in the course of method 300.

Next, at operation 304, the system determines recommended access point and/or sensor placements for the initial signal measurements. If the deployment environment has access points already deployed, these locations may be used as-is for the initial signal measurements. In some embodiments, the recommended initial access point locations may be based in part on one or more user criteria. For example, one user might prefer broad coverage, while another user might require high signal quality in particular locations. In some embodiments, initial channel assignments might also be determined during this process. For example, channels might be assigned in a random, non-overlapping pattern for the initial measurements.

In some embodiments, the initially recommended access point locations are based at least in part on modeled RF propagation throughout the deployment area as informed by the floor plan. For example, in floor plan 200, access points 212, 214, and 216 are placed such that the poor signal propagation through building core 208 does not adversely impact coverage for any location. In those embodiments where no existing deployment is in place, a number of access points needed to provide coverage might also be determined in addition to their placement. In some embodiments, access points may be added until the minimum estimated signal strength throughout the deployment area is above a predetermined threshold.

Broadly speaking, in some embodiments, operation 304 can be broken down into multiple (for example, three) sub-operations. First, a preliminary set of initial access point locations are selected. These preliminary initial locations may be randomly chosen or evenly distributed throughout the deployment location. Next, the signal strength throughout the deployment area for each access point based at least in part on the preliminary initial deployments can be estimated. If the entire deployment area has a high-enough signal strength for at least one access point, then processing can proceed to operation 306, otherwise the preliminary initial access point locations are perturbed until either adequate coverage is achieved or peak coverage is reached without the coverage being adequate. In the latter case, another access point can be added and the process restarted.

As an example of such an embodiment, a single access point may be deployed in a randomly selected initial location. The signal propagation throughout the deployment area can then be estimated based at least in part on the electromagnetic field propagation properties of open space and the various building materials. Generally speaking, the electrodynamics of the system are governed by Maxwell's equations, for which a number of numerical approximations are known. One of skill in the art will appreciate that various finite-difference time-domain methods or Lagrangian modeling techniques can be used to approximate the signal strength. For floor plan 200, it is unlikely that a single access point would provide adequate coverage. Thus, no matter how the location of the single initial access point is perturbed, the area of adequate signal strength is unlikely to include the entire deployment area. As such, a second access point may be added and the signal strength estimation process repeated.

As described above, for most wireless technologies there is a finite (e.g., small) number of channels available. Broadly speaking, signal strengths for different channels can be calculated independently; however where channels are reused, the signals from other access points on the same channel must be taken into account as noise when estimating the signal strength (or the signal-to-noise ratio). Once the signal strength for the deployment area has been estimated, the access point locations can be perturbed to determine the best coverage for the given number of access points. The access point locations can be varied slightly and the signal strengths throughout the deployment area re-measured. For example, the access point locations can be varied using a hill-climbing algorithm with the total area with adequate signal strength for at least one access point coverage as the objective function. To avoid settling on a local maximum, a Monte Carlo algorithm can be used to restart the hill-climbing algorithm from a variety of initial conditions until a maximal coverage for two access points is reached. Depending on the deployment environment, additional access points may be added and the process repeated until adequate coverage is achieved throughout the deployment environment.

In some embodiments, the initial sensor placements are determined based at least in part on the typical area and density of users with wireless devices (such as, for example, one sensor per anticipated device). In other embodiments, sensors are placed based at least in part on areas of particular importance to the user. In still other embodiments, sensors are placed based at least in part on both these factors and/or other factors. If the actual placements of the sensors (and/or access points) differ from the recommended placement, the actual locations may be updated on the ingested floor plan to maximize the accuracy of the coverage model.

Processing then proceeds to operation 306, where the deployed sensors 218 communicate with the access points 212, 214, and 216 in order to measure coverage at the location of each sensor. Sensors 218 used to conduct measurements may be actual devices representative of those to be used in the deployed network, or may be dedicated hardware devices that simulate representative traffic for a wide variety of use cases or (if specified by the user) one or more particularly relevant use cases. In some embodiments, different types of sensors may be used to represent different types of user devices. For example, a battery-powered Internet of Things (IoT) device might be represented by a sensor with a single-band, low-gain antenna, while a laptop of wireless repeater might be represented by a sensor with powered MIMO antennas. For example, if it is known that office 202 is a meeting room commonly used for video conferencing, then a sensor 218 may be placed in office 202 configured to simulate the high-bandwidth, low-latency traffic requirements of video conferencing. Similarly, a streaming video use case might be bandwidth sensitive but latency-insensitive, while a VoIP use case might be latency-sensitive but bandwidth-insensitive. Sensors 218 conducting measurements may be configured to test one or all of these use cases, alone or in combination, to measure the coverage of wireless network 126 as accurately as possible.

Sensors 218 may utilize a variety of metrics to measure coverage. For example, sensors 218 might measure the raw signal-to-noise ratio (SNR) for a given channel or frequency. Alternatively, the sensors might measure one or more higher-level network characteristics directly. For example, throughput, latency, jitter, and/or congestion might be measured under a given work load to measure the coverage. In some embodiments, sensors 218 have a complete network stack capable of generating and characterizing actual traffic similar to the type that will be present in the deployed environment. Other metrics might also be gathered unrelated to the signal from the access point. For example, the noise at each potential frequency might be measured. Such noise might be related to nearby, third-party wireless networks or sources of broadband RF noise (microwaves, electrical generators, etc.), and might suggest a different channel assignment for a particular access point. Alternatively, localized noise might be used to suggest additional electromagnetic shielding for the source (the microwave or electrical generator). The set of channel assignments for all access points can then be determined so as to reduce (e.g., minimize) in-network as well as out-of-network interference, as described below.

Operations 302-306 (or a subset of these operations) may be repeated a number of times depending on the number of available sensors and/or the size of the deployment area, until the coverage is fully mapped for the entire deployment area. The process of measuring the coverage and signal quality for the deployment area is discussed in additional detail in copending application Ser. No. 14/506,106, which is hereby incorporated by reference into the present specification. Once the signal measurements of the deployment area are complete, a heatmap or other visual representation of the signal quality and coverage may be generated and displayed to the user. For example, the signal quality at each point in the deployment area may be interpolated based at least in part on the signal quality at nearby sensors. The signal strength at each point can then be mapped to a color on a spectrum (for example, red might represent poor signal quality, yellow might represent moderate signal quality, and blue might represent high quality, with other strengths falling on the spectrum form red to blue) and overlain on the floor plan. The process of generating a graphic illustration of the signal quality and/or network performance for the deployment area is discussed in additional detail in copending application Ser. No. 15/048,801, which is hereby incorporated by reference into the present application.

Processing can then proceed to operation 308, where the signal coverage for alternate access point placements is simulated. To do this, the coverage quality (as measured by any of the metrics discussed above) is simulated many times with the access points shifted slightly each time. Unlike the purely simulation-based approaches discussed above as one way to generate the initial access point placements, the baseline coverage measurements gathered in operations 302-306 allow these simulations to more accurately reflect real-world conditions. Because the simulations employed in various embodiments are bounded by the initial measurement conditions, accuracy can be improved as compared to simulations that do not take into account physical measurements but rely solely on modeling.

For example, a signal strength simulation for the actual locations of the deployed access points can be performed. If the access points were deployed according to the initial deployment schema previously determined via simulation, then the original signal strength estimation can be used as the baseline. If the access points were deployed slightly differently than the initial deployment consideration (for example, because practical considerations made the suggested location for one or more access points impractical), then the as-deployed locations for the access points can be entered and a new baseline signal strength estimation generated using the techniques discussed above with respect to operation 304.

Once the baseline signal strength estimation has been generated, the estimated signal strength at each sensor can be compared to the signal strength measured by that sensor. Each of these points represents a boundary condition for the differential equations describing the electromagnetic field propagation. By providing these additional constraints to the approximation system, the accuracy of the simulated field propagation can be improved.

As an example of this, if baseline signal strength estimation estimates that the signal strength at a particular sensor should be −46 dB, and the actual reading from the sensor is −71 dB, then that indicates that the signal is not propagating from the access point to the sensor as well as the simulation would predict. Accordingly the propagation model in the simulation can be updated. For example, if only a single wall is between the access point and the sensor, and if other sensors not separated by a wall from the access point report signal strength similar to what the simulation predicts, then it may be an indication that the electromagnetic signal propagation properties for the wall are incorrect in the simulation are incorrect and should be updated. Similarly, if the received signal strength reported by all sensors for a particular access point is lower than the simulation would predict, it may indicate that the transmit power level for that access point is set incorrectly in the simulation and should be updated. Based at least in part on comparisons of the simulated signal strengths to the measured signal strengths, the simulation parameters can be updated and the simulations re-run until the simulated parameters more closely approximate the measured values.

As an example of the advantages provided by the various embodiments, consider again the deployment environment of FIG. 2. There, for example, in floor plan 200, measurements of signal strength between access point 212 and sensor 218 in kitchen 210 will show that building core 208 degrades the signal significantly. Thus, while a purely simulation-based approach might propose moving access point 212 closer to the center of the building to increase signal strength in kitchen 210, simulations based at least in part on the actual coverage map as measured at operation 306 will show that doing so would not significantly improve the signal strength, and would instead propose an alternate change more likely to result in actual improvement.

As one example of a simulation iteration, the location of a simulated access point placed in office 202 might be randomly shifted several feet. In other embodiments, the magnitude of the location shift might be larger or smaller. For example, the location of an access point might be randomly shifted by only several inches, or to an adjacent office. In some embodiments, a RF profile simulating the precise model of access points and/or client devices can be used in conducting the simulations to increase the accuracy of the simulation and the ultimate network performance and coverage.

In some embodiments, Monte Carlo simulation can be used to gather simulated signal coverage maps for a large number of randomly shifted access point placements. Based at least in part on a large random sampling of the placement space, optimal placements can be determined once all simulations have been completed. In other embodiments, hill-climbing techniques can be used to gradually shift access point placements to optimal locations. In such embodiments, the placement for each successive simulation may depend on the best placement previously determined. For example, if the signal quality at 50% or more of the sensors would improve for a given placement, then that placement may become the new baseline on which subsequent placements are based. Alternatively, the signal quality across all sensors may be averaged, with the aggregate change determining whether each placement is an improvement or not. One of skill in the art will appreciate that any of a large variety of empirical multivariate optimization algorithms can be used to determine access point placement based at least in part on random or iterated simulations of signal coverage, where each simulation is in turn based at least in part on the real-world coverage as measured at operations 302-306.

As a part of these simulations, or once access point placements have been determined, channels for each access point can be assigned. For example, if a particular access point was assigned a channel that has a significant source of localized noise during the initial measurements, then that access point might be assigned to a different channel or frequency. Of course, changing the channel for a single access point might cause a conflict with a neighbor, so that neighbor might also require channel reassignment, and other access points might also have sources of localized interference as well. In some embodiments, channels are assigned for one or more access points by first assigning channels to the access point(s) to avoid channel-specific interference, and then assigning channels to one or more other access points to maximize distance between access points sharing the same channel. In other embodiments, channels are initially assigned randomly for each iteration, and then the results for each assignment are compared across many iterations. The iteration with the channel assignment giving the best aggregate network throughput (for example) might then be selected to provide the final channel assignment.

Once all necessary simulations have been completed, access point locations and configurations can be presented to the user at operation 310. In some embodiments, a heatmap is presented showing the signal coverage for the deployment area together with the original access point locations, the new access point locations, and a channel assignment for each access point. One of skill in the art will appreciate that a variety of presentations can be employed, For example, two heat maps may be displayed, showing the original signal coverage and the predicted signal coverage. Alternatively, a single heat map showing the predicted change in signal coverage at each point may be displayed instead.

In some embodiments, the inclusion of additional access points to the wireless network 126 may be suggested as well, if the simulation process determined that a pre-specified level of signal coverage could not be achieved based at least in part on the access points present in the initial or proposed deployment. One of ordinary skill in the art will appreciate that other components, such as signal boosters, may also be recommended as determined to be necessary for optimal signal coverage.

Figure 4:
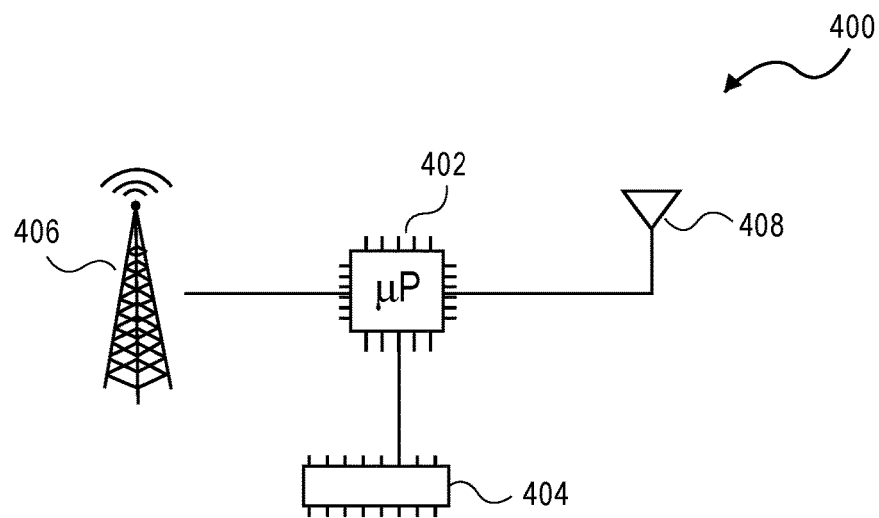
FIG. 4 depicts a block diagram illustrating the components of an example sensor in accordance with embodiments of the disclosure.

Turning now to FIG. 4, a block diagram illustrating an example sensor in accordance with embodiments of the disclosure is depicted and referred to generally by reference numeral 400. Broadly speaking, sensor 400 comprises processor 402, memory 404, and communications interface 406. In some embodiments, sensor 400 additionally comprises sensing device 408. Processor 402 may be any type of processor, as described above with respect to processor 106. Similarly, memory 404 is similar to memory modules 108 and/or data store 122 and may be transitory (e.g., RAM) or non-transitory (e.g. flash) memory and may be used for temporary storage of data during operation of sensor 400, for durable storage of program instructions when sensor 400 is inactive, or both. Communications interface 406 may be wired or wireless as described above with respect to network interface 124 and communicates data (e.g., signal data) with controller 500 (as described below). In some embodiments, signal data is also gathered by communications interface 406. In other embodiments, signal data is gathered by sensor device 408. Sensor device 408 may be a wireless communications interface or may be a dedicated sensor operable to collect a wide variety of data regarding electromagnetic signal in the vicinity of sensor 400. For example, sensor device 408 the signal strength from one or more nearby access points, a noise level on one or more frequencies or channels, or any other information. Sensor device 408 may further be active or passive. It will be appreciated that processor 402, whether configured through hardware or through execution of program instructions stored in memory 404, may be configured to perform and/or control performance of operations of a sensor device in accordance with various embodiments disclosed herein.

Figure 5:
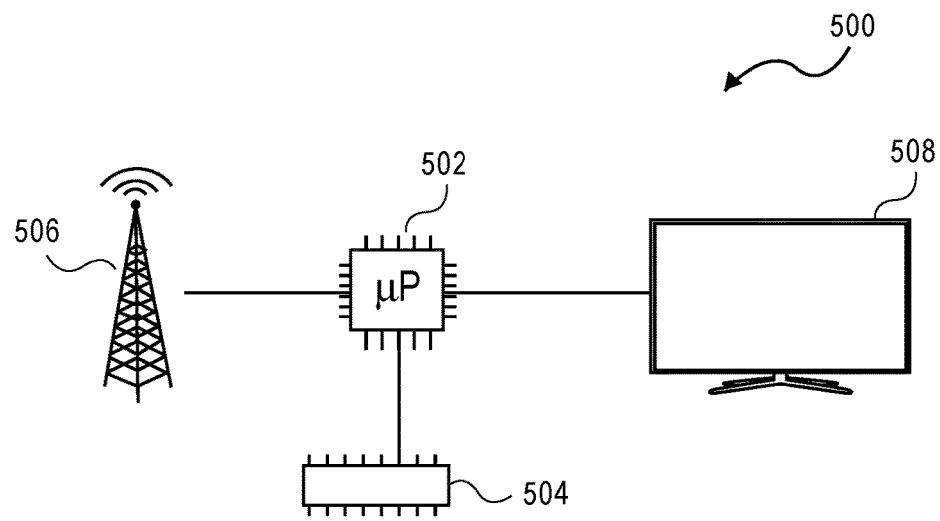
FIG. 5 depicts a block diagram illustrating the components of an example controller in accordance with embodiments of the disclosure.

Turning now to FIG. 5, a block diagram illustrating the components of an example controller in accordance with embodiments of the disclosure is depicted and referred to generally by reference numeral 500. Broadly speaking, controller 500 comprises processor 502, memory 504, communications interface 506, and display 508. Processor 502 may be any type of processor, as described above with respect to processor 106. Similarly, memory 504 is similar to memory modules 108 and/or data store 122 and may be transitory (e.g., RAM) or non-transitory (e.g. flash) memory and may be used for temporary storage of data during operation of controller 500, for durable storage of program instructions when controller 500 is inactive, or both. Although only a single instance of processor 502 and memory 504 is depicted, processor 502 and memory 504 could comprise multiple processors and memory units and could be embodied on single computing apparatus or distributed across a plurality of devices in network communication with each other. It will be appreciated that processor 502, whether configured through hardware or through execution of program instructions stored in memory 504, may be configured to perform and/or control performance of operations in accordance with various embodiments disclosed herein. Display 508 is operable to display a user interface allowing a user to view signal data from sensors such as sensor 400, proposed access point locations, and estimated signals strength data, as well as to enter data such as that relating to actual access point and sensor locations.

The operation of and information displayed by display 508 is discussed in greater detail above with respect to method 300.

Combinations of Features

Features described above as well as those claimed below may be combined in various ways without departing from the scope hereof. For example, it will be appreciated that aspects of a system or method for analyzing the performance of a wireless network may incorporate or swap features of another system or method for analyzing the performance of a wireless network described herein. The methods for analyzing the performance of a wireless network may incorporate features of systems disclosed herein, and systems for analyzing the performance of a wireless network may incorporate features of the disclosed methods. The following examples illustrate possible, non-limiting combinations of embodiments described above. It should be clear that many other changes and modifications may be made to the systems and methods described herein without departing from the spirit and scope of this invention:

(A1) A method of determining placements for a plurality of access points in a wireless network, comprising: ingesting a floor plan for a deployment site; determining a plurality of initial placements for the plurality of access points; determining a plurality of placements for a plurality of sensors, wherein each sensor is configured to wirelessly communicate with at least one access point of the plurality of access points; measuring a signal metric for each sensor of the plurality of sensors; based at least in part on the measured signal metric for each of the plurality of sensors, simulating a projected coverage map for each of a plurality of alternate placements for the plurality of access points; determining a placement of the plurality of alternate placements for the plurality of access points; and presenting, to a user, the placement of the plurality of access points.

(A2) In the method of (A1) the initial placements for the plurality of access points is based at least in part on a current deployment of the access points at the deployment site.

(A3) In any of the methods of (A1) or (A2), the plurality of placements for the plurality of sensors is based at least in part on current locations of a plurality of wireless devices connecting to the wireless network.

(A4) Any of the methods of (A1) through (A3), comprising: determining a optimal channel assignment for each of the plurality of access points; and presenting, to the user, the optimal channel assignment for each of the plurality of access points.

(A5) Any of the methods of (A1) through (A4), wherein the placement of the plurality of access points includes a heatmap indicating a projected value for the signal metric across the deployment site.

(A6) Any of the methods of (A1) through (A5), wherein the placement of the plurality of access points is determined using Monte Carlo simulation.

(A7) Any of the methods of (A1) through (A6), wherein the signal metric is network throughput to each sensor.

(B1) One or more non-transitory computer storage media storing program instructions that, when performed by at least one processor, cause the at least one processor to perform a method comprising: ingesting a floor plan for a deployment site; determining a plurality of initial placements for the plurality of access points, wherein determining the plurality of initial placements includes determining an estimated signal metric throughout the deployment site based at least in part on the plurality of initial placements for the plurality of access points; determining a plurality of placements for a plurality of sensors, wherein each sensor is configured to wirelessly communicate with at least one access point of the plurality of access points; measuring a signal metric for each sensor of the plurality of sensors; based at least in part on the measured signal metric for each of the plurality of sensors and the estimated signal metric at each of the plurality of sensors, simulating a projected coverage map for each of a plurality of alternate placements for the plurality of access points; determining a placement of the plurality of alternate placements for the plurality of access points; and causing presentation, to a user, the placement of the plurality of access points.

(B2) In the media of (B1) the plurality of initial placements is determined by repeatedly simulating a projected coverage map until the simulated projected coverage is above a minimum threshold.

(B3) In any of the media of (B1) or (B2) the method further comprises: determining an optimal channel assignment for each of the plurality of access points; and causing presentation, to the user, of the optimal channel assignment for each of the plurality of access points.

(B4) In any of the media of (B1) through (B3) the signal metric is received signal strength.

(B5) In any of the media of (B1) through (B3) the signal metric is a signal-to-noise ratio.

(B6) In any of the media of (B1) through (B5) the floor plan includes information indicative of the electromagnetic propagation properties of at least one component of the floor plan.

(B7) In any of the media of (B1) through (B6) the component of the floor plan is a wall and the information indicative of the electromagnetic propagation properties is a building material used to construct the wall.

(C1) A system for determining placements for a plurality of access points in a wireless network, comprising: a plurality of sensors, each sensor of the plurality of sensors configured to wirelessly communicate with at least one access point of the plurality of access points; and one or more computer storage media storing program instructions that, when performed by at least one processor, cause the at least one processor to perform a method of determining placements for a plurality of access points in a wireless network, the method comprising: ingesting a floor plan for a deployment site; determining, via a simulation of a signal metric, a plurality of initial placements for the plurality of access points; determining a plurality of placements for the plurality of sensors; measuring the signal metric for each sensor of the plurality of sensors; based at least in part on the measured signal metric for each of the plurality of sensors, simulating a projected coverage map for each of a plurality of alternate placements for the plurality of access points; determining a placement of the plurality of alternate placements for the plurality of access points; and presenting, to a user, the placement of the plurality of access points.

(C2) In the system denoted as (C1) the placement of the plurality of access points ensures that the signal metric at each sensor of the plurality of sensors is above a predetermined threshold.

(C3) In the system denoted as (C1) or (C2) the signal metric is received signal strength at the respective sensor.

(C4) In the system denoted as (C1) through (C3) the signal metric is throughput at the respective sensor.

(C5) In the system denoted as (C1) through (C4) the signal metric is a minimum video quality at the respective sensor.

(C6) In the system denoted as (C1) through (C5) the method further comprises: determining a optimal channel assignment for each of the plurality of access points; and causing presentation, to the user, of the optimal channel assignment for each of the plurality of access points.

(D1). An apparatus for determining placements for a plurality of access points in a wireless network, comprising: a processor; a communication interface communicatively coupled to a plurality of sensors, each sensor of the plurality of sensors configured to wirelessly communicate with at least one access point of the plurality of access points; a display configured to present a user interface to a user; and a memory storing program instructions that, when performed by the processor, cause the at least one processor to: ingest a floor plan for a deployment site; determine a plurality of initial placements for the plurality of access points, wherein determining the plurality of initial placements includes determining an estimated signal metric throughout the deployment site based at least in part on the plurality of initial placements for the plurality of access points; determine a plurality of placements for a plurality of sensors, wherein each sensor is configured to wirelessly communicate with at least one access point of the plurality of access points; receive a signal metric for each sensor of the plurality of sensors; based at least in part on the received signal metric for each of the plurality of sensors and the estimated signal metric at each of the plurality of sensors, simulate a projected coverage map for each of a plurality of alternate placements for the plurality of access points; cause the display to present, to the user, the placement of the plurality of access points.

Many different arrangements of the various components depicted, as well as components not shown, are possible without departing from the scope of the claims below. Embodiments of the disclosure have been described with the intent to be illustrative rather than restrictive. Alternative embodiments will become apparent to readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims. Although various embodiments have been described with reference to the embodiments illustrated in the attached drawing figures, it is noted that equivalents may be employed and substitutions made herein without departing from the scope of the disclosure and the appended claims.

Having thus described various embodiments, what is claimed as new and desired to be protected by Letters Patent includes the following:

Having thus described various embodiments, what is claimed as new and desired to be protected by Letters Patent includes the following:

1. A method of determining placements for a plurality of access points in a wireless network, comprising:
   ingesting a floor plan for a deployment site;
   determining a plurality of initial placements for the plurality of access points in the deployment site;
   determining a plurality of placements for a plurality of sensors, wherein each sensor is configured to wirelessly communicate with at least one access point of the plurality of access points;
   measuring at least one signal metric for each sensor of the plurality of sensors while said plurality of sensors are in communications with the plurality of access points at the initial placements;
   based at least in part on the at least one measured signal metric for each of the plurality of sensors, the plurality of sensors being in communication with the plurality of access points while positioned at the initial placements, simulating a projected coverage map for each of a plurality of alternate placements for each of the plurality of access points;
   determining a new placement for each of the plurality of alternate placements for the plurality of access points; and
   presenting, to a user, the new placement of the plurality of access points.

2. The method of claim 1, wherein the plurality of initial placements for the plurality of access points are based at least in part on a current deployment of existing access points at the deployment site.

3. The method of claim 1, wherein the plurality of placements for the plurality of sensors is based at least in part on current locations of a plurality of existing wireless devices connecting to the wireless network.

4. The method of claim 1, further comprising:
   determining an optimal channel assignment for each of the plurality of access points; and
   presenting, to the user, the optimal channel assignment for each of the plurality of access points.

5. The method of claim 1, wherein the placement of the plurality of access points includes a heatmap indicating a projected value for the at least one signal metric across the deployment site.

6. The method of claim 1, wherein the placement of the plurality of access points is determined using Monte Carlo simulation.

7. The method of claim 1, wherein the at least one signal metric is one of: (i) network throughput to each sensor; (ii) signal strength; and (iii) signal-to-noise ratio.

8. The method of claim 1, wherein the plurality of wireless devices are configured to emulate an existing wireless device existing in the deployment site, the existing wireless device being intended to remain in the wireless network.

9. The method of claim 1, wherein the simulating, determining, and presenting steps are repeated a plurality of times until each of the plurality of access points are at final locations, the final locations resulting in an acceptable overall wireless coverage result for a network intended for the deployment site.

10. The method of claim 1, wherein the at least one signal metric comprises a plurality of signal metrics, and the plurality includes all of: (i) network throughput; (ii) signal strength; and (iii) signal-to-noise ratio.

11. One or more non-transitory computer storage media storing program instructions that, when performed by at least one processor, cause the at least one processor to perform a method comprising:
   ingesting a floor plan for a deployment site;
   determining a plurality of initial placements for the plurality of access points in the deployment site,
   wherein determining the plurality of initial placements includes determining an estimated signal metric throughout the deployment site based at least in part on the plurality of initial placements for the plurality of access points;
   determining a plurality of placements for a plurality of sensors, wherein each sensor is configured to wirelessly communicate with at least one access point of the plurality of access points;

measuring a signal metric for each sensor of the plurality of sensors while said plurality of sensors are in communications with the plurality of access points at the initial placements;

based at least in part on the measured signal metric for each of the plurality of sensors and the estimated signal metric at each of the plurality of sensors, the plurality of sensors being in communication with the plurality of access points while positioned at the initial placements, simulating a projected coverage map for each of a plurality of alternate placements for each of the plurality of access points;

determining a new placement for each of the plurality of alternate placements for the plurality of access points; and causing presentation, to a user, of the new placement of the plurality of access points.

12. The media of claim 11, wherein the plurality of initial placements is determined by repeatedly simulating a projected coverage map until the simulated projected coverage is above a minimum threshold.

13. The media of claim 11, wherein the floor plan includes information indicative of the electromagnetic propagation properties of at least one component of the floor plan.

14. The media of claim 13, wherein the component of the floor plan is a wall and the information indicative of the electromagnetic propagation properties is a building material used to construct the wall.

15. A system for determining placements for a plurality of access points in a wireless network, comprising:
   a plurality of sensors, each sensor of the plurality of sensors configured to wirelessly communicate with at least one access point of the plurality of access points; and
   one or more computer storage media storing program instructions that, when performed by at least one processor, cause the at least one processor to perform a method of determining placements for each of the plurality of access points in the wireless network, the method comprising:
      ingesting a floor plan for a deployment site;
      determining, via a simulation of a signal metric, a plurality of initial placements for the plurality of access points in the floor plan;
      determining a plurality of placements for the plurality of sensors;
      measuring the signal metric for each sensor of the plurality of sensors using the plurality of access points simultaneously, the measuring being based at least in part on the measured signal metric for each of the plurality of sensors, simulating a projected coverage map for each of a plurality of alternate placements for the plurality of access points;
      determining a placement of the plurality of alternate placements for the plurality of access points; and
      presenting, to a user, the placement of the plurality of access points.

16. The system of claim 15, wherein the placement of the plurality of access points ensures that the signal metric at each sensor of the plurality of sensors is above a predetermined threshold.

17. The system of claim 15, wherein the signal metric is received signal strength at the respective sensor.

18. The system of claim 15, wherein the signal metric is throughput at the respective sensor.

19. The system of claim 15, wherein the signal metric is a minimum video quality at the respective sensor.

20. The system of claim 15, wherein the method further comprises:
   determining a optimal channel assignment for each of the plurality of access points; and
   causing presentation, to the user, of the optimal channel assignment for each of the plurality of access points.

21. An apparatus for determining placements for a plurality of access points in a wireless network, comprising:
   at least one processor;
   a communication interface communicatively coupled to a plurality of sensors, each sensor of the plurality of sensors configured to wirelessly communicate with at least one access point of the plurality of access points; and
   at least one memory storing program instructions that, when performed by the at least one processor, cause the at least one processor to:
      ingest a floor plan for a deployment site;
      determine a plurality of initial placements for the plurality of access points in the floor plan for the deployment site,
      wherein, when the processor determines the plurality of initial placements, the instructions further cause the processor to determine an estimated signal metric throughout the deployment site based at least in part on the plurality of initial placements for the plurality of access points;
      receive a signal metric for each sensor of the plurality of sensors using the plurality of access points, the plurality of access points receiving the signal metrics simultaneously while remaining at each of the plurality of initial placements;
      determine a placement of the plurality of alternate placements for the plurality of access points; and
      cause presentation of the placement of the plurality of access points.

* * * * *